United States Patent [19]

Kubo

[11] Patent Number: 5,562,492
[45] Date of Patent: Oct. 8, 1996

[54] CONTACT ALIGNING STRUCTURE IN IC SOCKET

[75] Inventor: Masaaki Kubo, Tokyo, Japan

[73] Assignee: Yamaichi Electronics Co., Ltd., Tokyo, Japan

[21] Appl. No.: 338,736

[22] Filed: Nov. 9, 1994

[30] Foreign Application Priority Data

Nov. 12, 1993 [JP] Japan .................... 5-307335

[51] Int. Cl.⁶ ................................... H05K 1/00
[52] U.S. Cl. ................................... 439/526
[58] Field of Search .................. 439/331, 174, 439/268, 330, 329, 526, 264

[56] References Cited

U.S. PATENT DOCUMENTS

| Re. 32,370 | 3/1987 | Bright et al. | 439/331 |
|---|---|---|---|
| 3,846,737 | 11/1974 | Spaulding | 439/331 |
| 4,872,845 | 10/1989 | Korsunsky et al. | 439/330 |
| 5,102,346 | 4/1992 | Soes | 439/331 |
| 5,348,483 | 9/1994 | Sagano | 439/526 |

*Primary Examiner*—Neil Abrams
*Assistant Examiner*—Yong Kim
*Attorney, Agent, or Firm*—Wenderoth, Lind & Ponack

[57] ABSTRACT

In an IC socket, a downward movement of a pressing member imparts a downwardly directed force to an IC body or IC terminal portions and causes a resilient downward shifting of contact point portions of contacts which are implanted in a socket body, and by reaction thereof, a contact pressure between the contact point portions and the IC terminal portions is realized. A contact aligning structure for this IC socket includes a side pressing portion which is caused to press the contact point portions so as to be resiliently forwardly shifted when the pressing member is moved downwardly, an aligning surface for aligning the contact point portions being defined by that surface of the side pressing portion which is caused to press the contact point portions.

6 Claims, 4 Drawing Sheets

5,562,492

CONTACT ALIGNING STRUCTURE IN IC SOCKET

BACKGROUND OF THE INVENTION

1. Field of the Invention

This invention relates to a contact aligning structure for correctly aligning contacts when an IC is pressed against the contacts, in an IC socket of the type in which an IC is pressed against the contacts by a pressing member in order to obtain electrical and physical contact.

2. Brief Description of the Prior Art

Heretofore, there has been known an IC socket, as one type of electrical and physical connection between terminal portions of an IC and contacts of a socket, in which a downwardly directed force is applied to an IC body or IC terminal portions by a pressing cover provided on the socket or by an IC carrier for carrying the IC thereon. This force causes contact point portions of the contacts with the IC terminal portions placed thereon to be resiliently downwardly shifted by this downwardly directed force, thereby creating a contact pressure between the contact point portions and the IC terminal portions due to reaction thereof.

However, in the socket of the above-mentioned type, as the arrangement pitches of the IC terminals become smaller and smaller, contacting areas of the IC terminal portions become smaller and smaller. Therefore, to obtain a reliable contact is an important problem. Particularly, when the contact point portion supported by the spring portion of each contact is shifted downwardly upon downward movement of the pressing portion, a backward shifting component of the contact point portion is also generated and therefore, there is a possibility that inferior contact will occur for some part of the contact point portion because the contact point portion may come out of the area of the IC terminal portion when the pressing member makes a final downward movement.

Also, it is unavoidable that alignment of the contact point portions becomes irregular due to errors of implanting positions of the contacts, errors of manufacture of the contacts, and the like. Depending on the degree of irregularity, it becomes difficult to obtain reliable contact with the IC terminal portions. This problem becomes more serious as the length dimension of the spring portion for supporting the contact point portion is increased in order to assume more reliable contact.

SUMMARY OF THE INVENTION

It is, therefore, an object of the present invention to provide a contact aligning structure in an IC socket, which is capable of making more positive alignment of contacts.

In order to achieve the above object, a contact aligning structure is provided in an IC socket of the type in which a downward movement of a pressing member imparts a downwardly directed force to an IC body or IC terminal portions and causes a resilient downward shifting of contact point portions of contacts which are implanted in a socket body, and by reaction thereof, a contact pressure between the contact point portions and the IC terminal portions is created. The contact aligning structure includes a side pressing portion which is caused to press the contact point portions so as to be resiliently forwardly shifted when the pressing member is moved downwardly, and aligning surface for aligning the contact point portions being defined by that surface of the side pressing portion which is caused to press the contact point portions.

With the present invention thus constructed, first, upon downward movement of the pressing member, the contact point portions of the contacts are resiliently downwardly shifted and a contact pressure with the IC terminal portions is obtained by reaction thereof. By virtue of a provision of the side pressing portion on the pressing member, upon downward movement of the pressing member, the side pressing portion is resiliently shifted forwardly to urge the contact point portions forwardly, and by causing the contact point portions to be resiliently contacted with the aligning surface of the side pressing portion for pressing the contact point portions, the contact point portions can be correctly aligned along this aligning surface. By doing this, the contact point portions of the contacts can be aligned in a predetermined position, thus enabling realization of a positive electrical and physical contact with the IC terminal portions.

The novel features which are considered characteristic of this invention are set out in the appended claims. The invention itself, however, together with additional objects and advantages thereof will be best understood from the following detailed description taken in conjunction with the accompanying drawings which illustrate, by way of example only, preferred embodiments of this invention.

DETAILED DESCRIPTION OF THE EMBODIMENTS

Embodiments of the present invention will be described in detail with reference to FIGS. 1 to 9 of the accompanying drawings.

Figure 1:
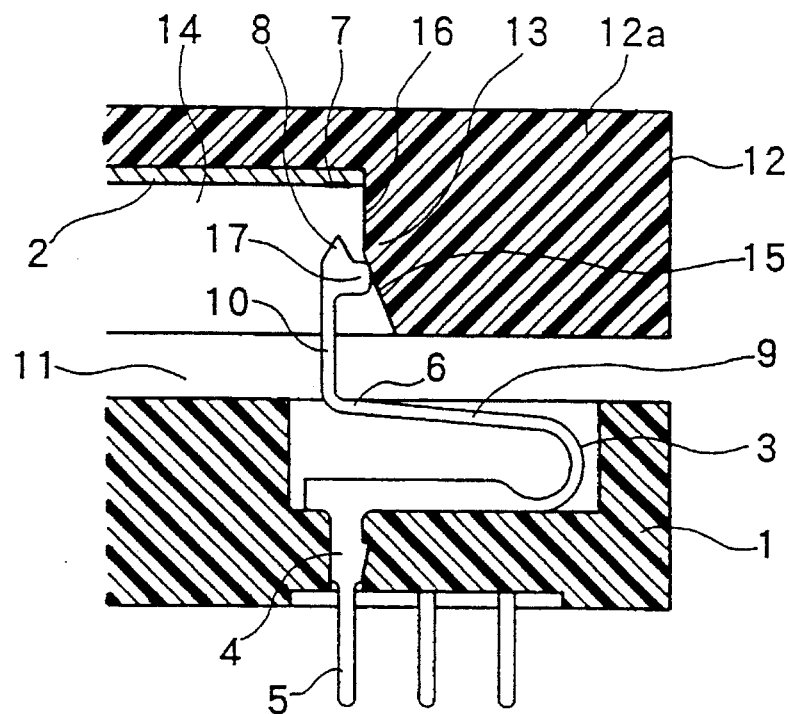
FIG. 1(A) is a cross-sectional view of an important portion of an IC socket showing a contact aligning structure according to one embodiment of the present invention and FIG. 1(B) is a cross-sectional view of an important portion of a contact aligning structure according to another embodiment of the present invention.
Figure 1:
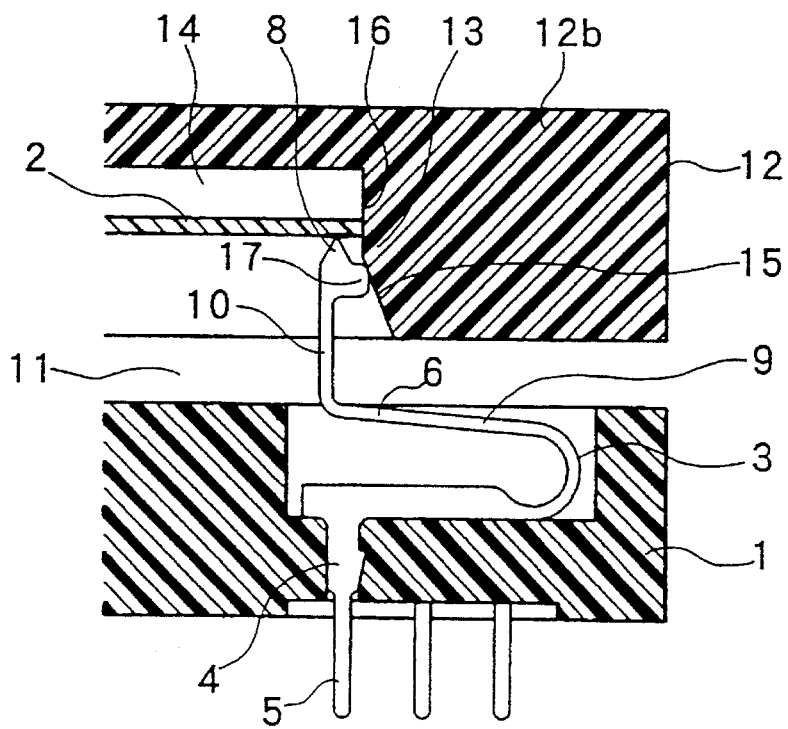
Figure 2:
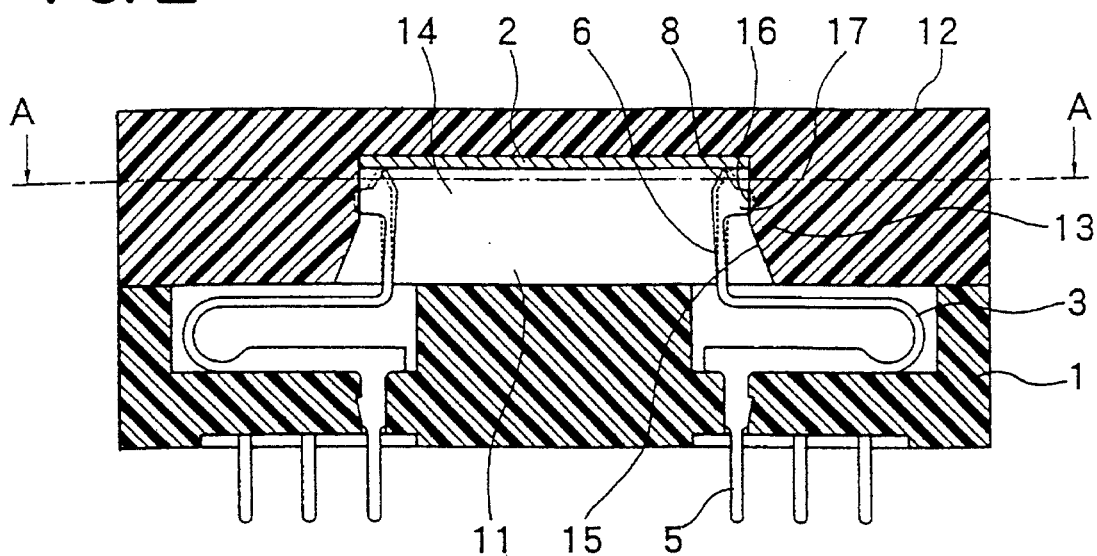
FIG. 2 is a cross-sectional view of an IC socket showing a state in which alignment of the contacts is completed in FIGS. 1(A) and 1(B)

An IC socket has a socket body 1 formed of a planar square insulating board, and the socket body 1 includes a plurality of contacts 3 adapted to make electrical and physical contact with an IC 2. As shown in FIG. 2, those contacts 3 are implanted in the socket body 1, each contact 3 including a male pin 5 extending downwardly of the socket body 1 from its implanted portion 4, and a contact element portion 6 extending upwardly toward the upper surface of the socket body 1.

Each male pin 5 is a means for insertion into a corresponding one of the through-holes formed in a wiring board for connection, whereas each contact element portion 6 is a means for making electrical and physical contact with a corresponding one of the terminal portions 7 of an IC 2.

For each contact 3, the contact element portion 6 includes a first spring portion 9 for resiliently shifting a contact point portion 8 to be contacted with the IC terminal portion 7 upwardly and downwardly. This first spring portion 9 is connectively disposed next to the implanted portion 4 and forwardly upwardly inclined from the implanted portion 4. Also, the first spring portion 9 is extended forwardly in a horizontal posture or in a forwardly upwardly inclined posture. An upwardly projecting second spring portion 10 for resiliently shifting the contact point portion 8 forwardly and backwardly is connectively disposed next to a front end portion of the first spring portion 9. The contact point portion 8 to be contacted with the IC terminal 7 is provided on an upper end portion of the second spring portion 10.

The first spring portion 9, as mentioned above, is a means for resiliently shifting the contact point portion 8 of the contact 3 upwardly and downwardly, whereas the second spring portion 10 is a means for shifting the contact point portion 8 forwardly and backwardly. The second spring portion 10 is, as illustrated, generally perpendicular or forwardly inclined relative to upper and lower surfaces of the IC 2.

Figure 3:
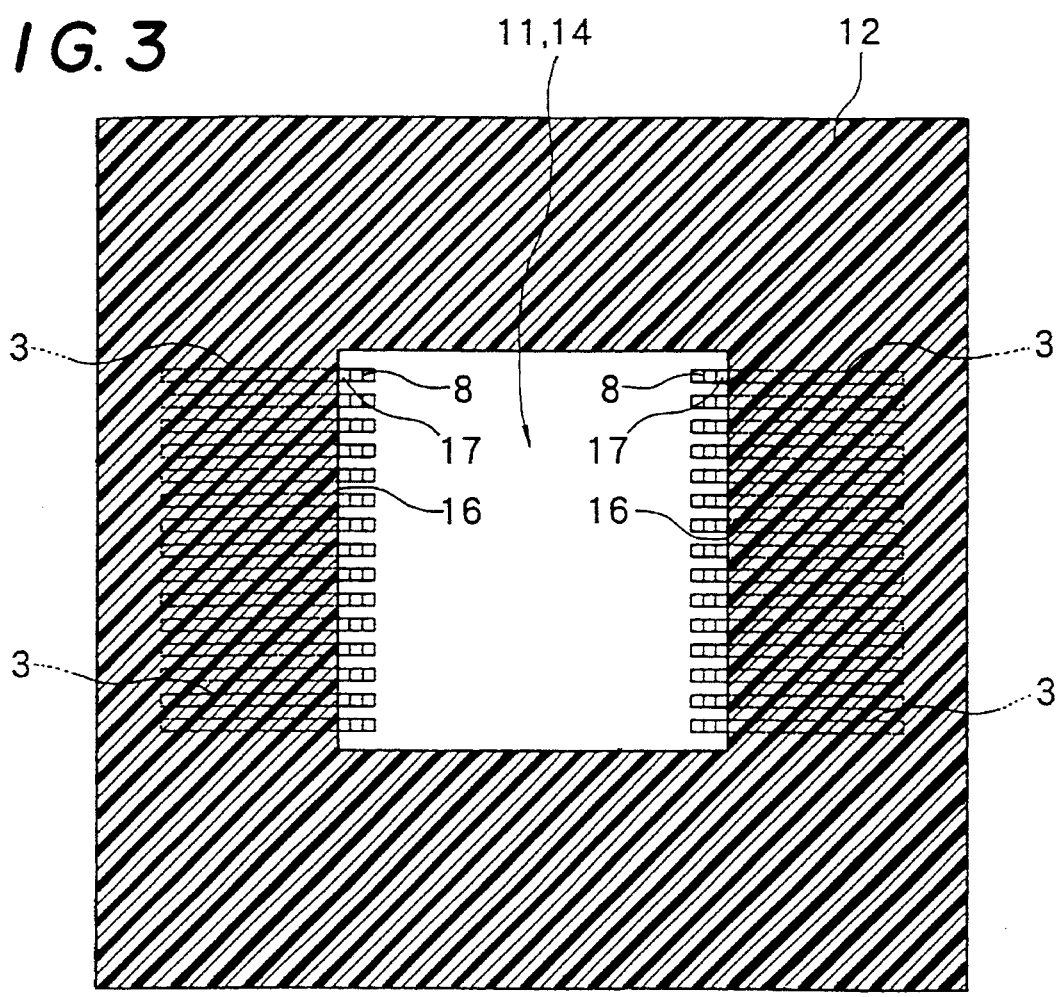
FIG. 3 is a cross-sectional view taken on line A—A of FIG. 2.
Figure 4:
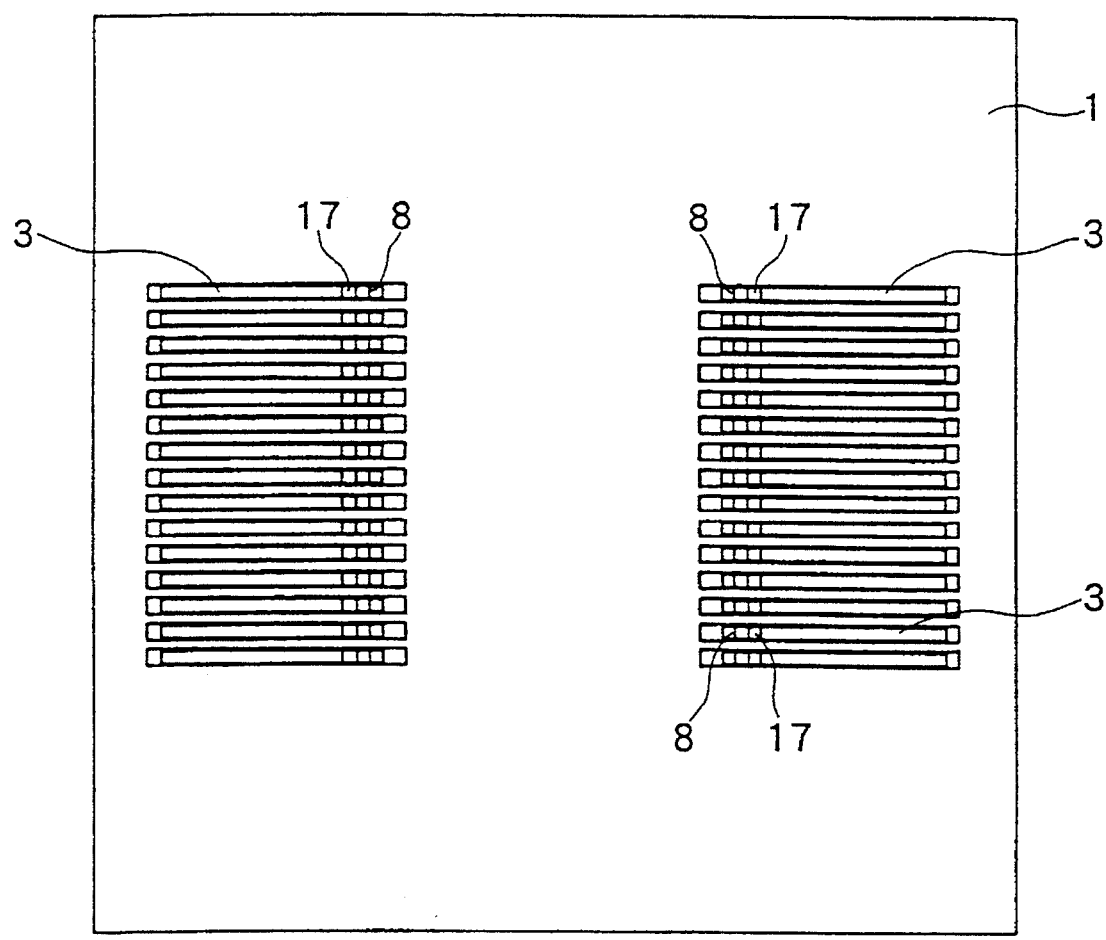
FIG. 4 is a plan view of a socket body.
Figure 5:
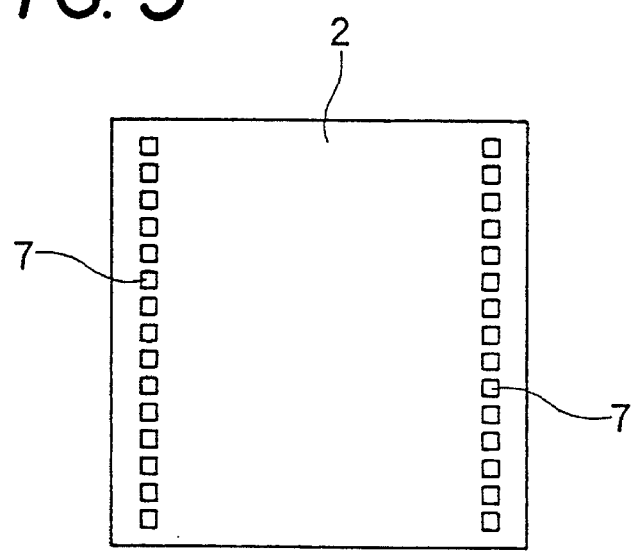
FIG. 5 is a bottom view of an IC.

As shown in FIGS. 3 and 4, the plurality of contacts are arranged in an array on the socket body 1 along two or four opposed sides of an IC placing space 11. An IC pressing means is disposed at an upper location of the socket body 1. This pressing means 12 is an actuator exclusively used for pressing the IC terminal portion 7 against the contact point portion 8 of the contact 3, or a carrier used for protection of the IC 2. Also, this IC pressing means may be a jig mounted on a robot arm.

The IC pressing means 12 is provided with a side pressing portion 13 which is allowed to extend along the backs of the contact point portions 8 of the respective array of contacts 3. An IC receiving portion 14, which is open toward an upper surface of the socket body 1, is defined at an inner side of the side pressing portions 13. On the inner surface of the IC receiving portion 14, i.e., on the inner surfaces of the side pressing portions 13, a guide surface 15 formed of a slant surface and an aligning surface 16 formed of a vertical surface are formed.

The guide surface 15 and aligning surface 16 are extended along the backs of the contact point portions 8 of the respective array of contacts 3. The guide surface 15 is disposed at an open end side of the IC receiving portion 14, whereas the aligning surface 16 is disposed at an inner side of the IC receiving portion 14, both the guide surface 15 and aligning surface 16 being connectively disposed relative to each other.

The contact point portion 8 of each contact 3 is provided with a lug projecting backwardly. This lug serves as a pressure receiving portion 17.

In operation, as shown in FIG. 1(A), the IC 2 carried on a carrier 12a acting as the IC pressing means 12 is placed on the socket body 1, or as shown in FIG. 1(B), the IC 2 alone is placed directly on the socket body 1. Then, when the carrier 12a or the exclusive actuator 12b are moved downwardly, the contact point portion 8 of each contact 3, as shown in FIG. 2, is caused to slide on the guide surface 15 and is shifted forwardly as the pressure receiving portion 17 is pressed forwardly by the guide surface 15 formed of a slant surface, while permitting flexure of the second spring 10. As the downward movement of the pressing means 12 proceeds further, the contact point portion 8 is caused to slide onto the aligning surface 16 from the guide surface 15 and resiliently held on the aligning surface 16 in a state where a resilient force is accumulated. As a result, the contact point portions 8 are aligned for each array of the contacts 3.

In such aligned state of each contact point portion 8, the IC terminal portion 7 is pressed against an upper end of the contact point portion 8. As a result, a contact pressure can be obtained. That is, upon downward movement of the IC pressing means 12, the contact point portions 8 of the contacts 3 are aligned by the aligning surface 16. Also, the downward movement of the pressing means 12 causes the IC 2 to be depressed downwardly. By the downwardly directed force given to the IC 2, the IC terminal portion 7 is pressed against the contact point portion 8 to shift the first spring portion 9 downwardly, and by reaction thereof, a contact force between the contact point portion 8 and the IC terminal portion 8 is obtained.

In the illustrated embodiment, the timing is set such that the alignment of the contact point portions 8 is performed first, and after the completion of alignment, the IC terminal portion 7 is pressed against the contact point portions 8. However, this timing can be optionally set. For example, the IC terminal portion 7 may be pressed against the contact point portion 8 of one of the contacts 3 during the course of alignment of the contact point portions.

Figure 6:
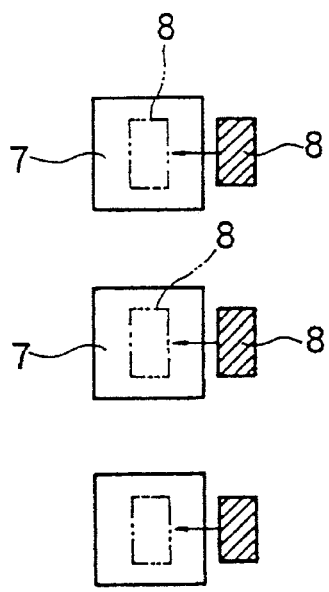
FIG. 6 is an explanatory view for explaining one way to align contacting portions of the contacts relative to IC terminal portions.

According to the present invention, as shown in FIG. 6, it is possible that the contact point portions 8 are implanted in locations outside the IC terminal portions 7 and the IC terminal portions 7 are moved respectively to predetermined positions when the pressing means 12 is activated.

Figure 7:
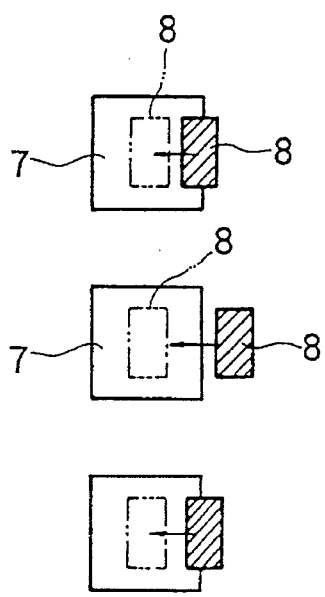
FIG. 7 is an explanatory view for explaining another way to align the contacting portions of the contacts relative to an IC terminal portions.

As shown in FIG. 7, the contacts 3 may be implanted such that the contact point portions 8 correspond to the predetermined positions of the IC terminal portions 7, and the contact point portions 8 are correctly aligned by rectifying irregular arrangement of the contact point portions 8 during the downward movement of the pressing means 12.

Figure 8:
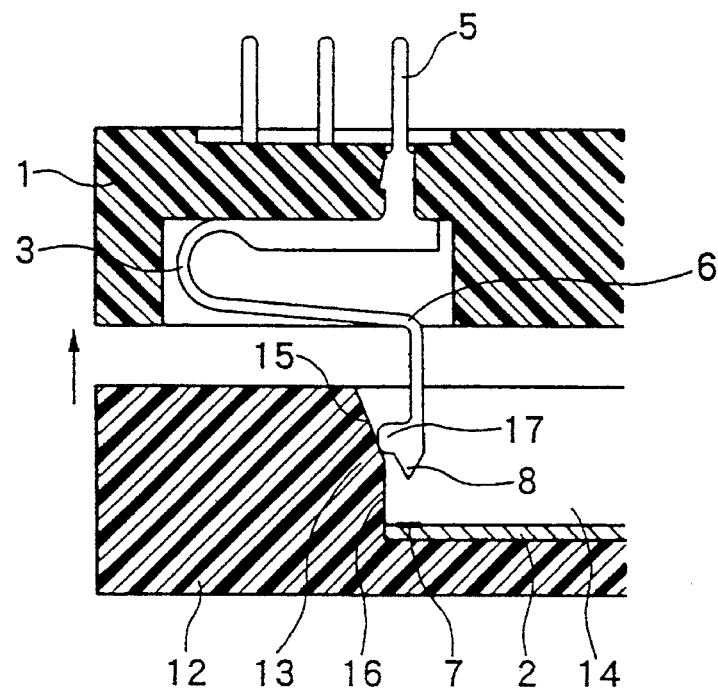
FIG. 8 is a cross-sectional view of an important portion showing an example in which the above-mentioned IC socket is used in its inverted posture.

Also, the present invention may be used in its inverted posture as shown in FIG. 8. In this case, the sense of upper or upward in FIG. 8 refers to the sense of lower or downward defined in claims, and the sense of lower or downward in FIG. 8 refers to upper or upward defined in claims.

Figure 9:
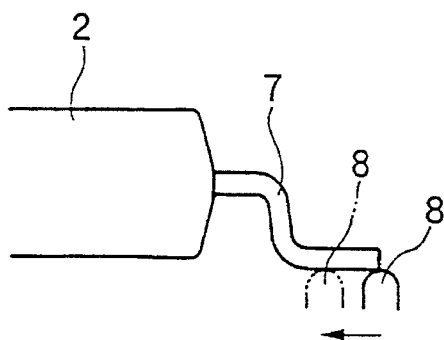
FIG. 9 is a side view of an important portion in which the present invention is applied to a gull-wing type IC.

In FIGS. 1 to 8 inclusive, although an IC 2 provided with a plurality of electrically conductive pads (IC terminal portions 7) intimately attached to a surface thereof is exemplified, the present invention can be applied to an IC of the type in which IC terminal portions 7 project sideways of an IC 2 as shown in FIG. 9. Examples of this type of IC include the illustrated gull-wing type IC having leads bent like a letter "L", and a flat type IC having leads horizontally projected. As shown in FIG. 9, upon downward movement of the IC pressing means 12, the contact point portion 8 is forwardly shifted from a position as shown by a solid line to a position as shown by an interrupted line for alignment.

According to the present invention, upon downward movement of the IC pressing member, the IC terminal portions can be pressed against the contact point portions, thereby enabling the realization of a contact pressure, and at the same time, all the contact point portions can be aligned in the predetermined positions corresponding to the IC terminal portions by the aligning surface which is provided on the IC pressing member. Therefore, a contact aligning structure in an IC socket according to the present invention can be effectively utilized as means for rectifying irregular correspondence, if any, between the contact point portions and the IC terminal portions due to the IC terminal portions being arranged at smaller pitches and having smaller dimensions.

Although this invention has been described in its preferred form with a certain degree of particularity, it is understood that the present disclosure of the preferred form has been made only by way of example and that numerous changes in the details of construction and arrangement of parts may be resorted to without departing from the spirit and the scope of the invention as hereinafter claimed.

What is claimed is:

1. An IC socket comprising:

a socket body having a central portion and a peripheral portion;

at least one row of contacts fixed to said socket body and projecting generally upwardly therefrom, each of said contacts including a contacting portion which is resiliently shiftable in both a substantially outward-to-inward direction and a substantially vertical direction;

an IC pressing member mountable on said socket body and having a central portion and a peripheral portion;

wherein a downwardly opening IC receiving portion is defined in said central portion of said IC pressing member, said IC receiving portion having inwardly facing side walls, at least one of said side walls constituting a side pressing portion;

wherein said side pressing portion includes a substantially vertical alignment surface and a guide surface contiguous with said alignment surface;

wherein said guide surface is inclined relative to said alignment surface in a direction downwardly and outwardly, and is disposed at a lower end of said IC receiving portion for slidably guiding said contacting portion of each of said contacts inwardly into engagement with said alignment surface in said IC receiving portion as said IC pressing member is pressed downwardly toward said socket body, to thereby align said contacting portions of said contacts with terminals of an IC received in said IC receiving portion of said IC pressing member.

2. An IC socket as recited in claim 1, wherein said at least one row of contacts comprises a plurality of rows of contacts; and a plurality of said side walls of said IC receiving portion constitute side pressing portions.

3. An IC socket as recited in claim 1, wherein each of said contacts includes a spring portion for allowing resilient inward shifting of said contacting portion.

4. An IC socket as recited in claim 1, wherein each of said contacts includes a spring portion for allowing resilient vertical shifting of said contacting portion.

5. An IC socket as recited in claim 1, wherein each of said contacts includes a first spring portion for allowing resilient vertical shifting of said contacting portion, and a second spring portion for allowing resilient inward shifting of said contacting portion.

6. An IC socket as recited in claim 1, wherein each of said contacts includes a lug portion projecting outwardly from said contacting portion and defining a pressure receiving portion slidably engageable with said side pressing portion.

* * * * *